US012793927B2

(12) United States Patent
Biloiu et al.

(10) Patent No.: US 12,793,927 B2
(45) Date of Patent: Nov. 10, 2026

(54) RESONATOR, LINEAR ACCELERATOR CONFIGURATION AND ION IMPLANTATION SYSTEM HAVING TAPERED RESONATOR

(71) Applicant: Applied Materials, Inc., Santa Clara, CA (US)

(72) Inventors: Costel Biloiu, Rockport, MA (US); David Morrell, Wakefield, MA (US); William Herron Park, Jr., Marblehead, MA (US); David T. Blahnik, Round Rock, TX (US); Wai Ming Tam, Georgetown, MA (US); Frank Sinclair, Hartland, ME (US); Christopher Campbell, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 351 days.

(21) Appl. No.: 18/653,650

(22) Filed: May 2, 2024

(65) Prior Publication Data

US 2025/0343023 A1 Nov. 6, 2025

(51) Int. Cl.

| | |
|---|---|
| ***H01J 37/08*** | (2006.01) |
| ***H01J 37/317*** | (2006.01) |
| ***H05H 7/02*** | (2006.01) |
| ***H05H 7/22*** | (2006.01) |
| ***H05H 9/00*** | (2006.01) |

(52) U.S. Cl.

CPC .......... *H01J 37/08* (2013.01); *H01J 37/3172* (2013.01); *H05H 7/02* (2013.01); *H05H 7/22* (2013.01); *H05H 9/00* (2013.01); *H05H 2007/025* (2013.01); *H05H 2007/222* (2013.01)

(58) Field of Classification Search

CPC ........ H01J 37/08; H01J 37/3172; H05H 7/02; H05H 7/22; H05H 9/00; H05H 2007/025; H05H 2007/222; H05H 2277/12; H05H 7/18

USPC ........................................... 250/492.1–492.3

See application file for complete search history.

(56) References Cited

U.S. PATENT DOCUMENTS

| | | | | |
|---|---|---|---|---|
| 6,653,803 | B1 * | 11/2003 | DiVergilio | H05H 7/02 315/505 |
| 11,094,504 | B2 * | 8/2021 | Biloiu | H01J 23/18 |
| 2021/0210307 | A1 * | 7/2021 | Biloiu | H01J 23/20 |
| 2022/0174810 | A1 * | 6/2022 | Biloiu | H05H 7/22 |
| 2023/0134262 | A1 * | 5/2023 | Kowal | H01J 37/04 250/492.21 |

* cited by examiner

*Primary Examiner* — Michael Maskell
(74) *Attorney, Agent, or Firm* — KDW Firm PLLC

(57) ABSTRACT

An ion implanter. The ion implanter may include an ion source to generate an ion beam; and a linear accelerator, to transport and accelerate the ion beam, the linear accelerator comprising a plurality of acceleration stages. A given acceleration stage of the plurality of acceleration stages may include an RF power supply, arranged to output an RF signal, and a drift tube assembly, arranged to transmit the ion beam, and coupled to the RF power supply. The given stage may also include a resonator, the resonator comprising a resonator enclosure, having a tapered shape, wherein the resonator enclosure has a first width in a middle location, a second width at a first end and a third width at a second end, wherein the first width is greater than the second width and greater than the third width.

20 Claims, 6 Drawing Sheets

RESONATOR, LINEAR ACCELERATOR CONFIGURATION AND ION IMPLANTATION SYSTEM HAVING TAPERED RESONATOR

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via ion bombardment. Ion implantation systems may comprise an ion source and a series of beam-line components. The ion source may comprise a chamber where ions are generated. The ion source may also comprise a power source and an extraction electrode assembly disposed adjacent the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an RF voltage signal. Known LINACs are driven by an RF voltage applied at frequencies between 13.56 MHz-120 MHz.

In known LINACs (for the purposes of brevity, the term LINAC as used herein may refer to an RF LINAC using RF signals to accelerate an ion beam) in order to reach a targeted final energy, such as one MeV, several MeV, or greater, the ion beam may be accelerated in multiple acceleration stages. Each successive stage of the LINAC may receive the ion beam at increasingly higher energy, and accelerate the ion beam to still higher energy.

Current LINAC designs for ion implanters employ a resonator that has a solenoidal coil to deliver an RF voltage to a powered electrode of the LINAC. One limitation of such coils is that the shunt impedance may have a value of approximately 1.4 MOhms. At this shunt impedance value, a relatively large power is called for in order to drive high voltages that are needed to accelerate ions to a desired energy. For example, to generate accelerating voltage in a given acceleration stage of greater than 100 kV, an RF power supply should supply power on the order of 6 kW. Given that a LINAC may employ 10 acceleration stages or more, with dedicated power supplies for each acceleration stage, the total cost and size of such a high power LINAC may be excessive.

With respect to these and other considerations the present disclosure is provided.

BRIEF SUMMARY

In one embodiment an ion implanter is provided. The ion implanter may include an ion source to generate an ion beam; and a linear accelerator, to transport and accelerate the ion beam, the linear accelerator comprising a plurality of acceleration stages. A given acceleration stage of the plurality of acceleration stages may include an RF power supply, arranged to output an RF signal, and a drift tube assembly, arranged to transmit the ion beam, and coupled to the RF power supply. The given stage may also include a resonator, the resonator comprising a resonator enclosure, having a tapered shape, wherein the resonator enclosure has a first width in a middle location, a second width at a first end and a third width at a second end, wherein the first width is greater than the second width and greater than the third width.

In another embodiment, a resonator for a linear accelerator is provided. The resonator may include a resonator enclosure, having a tapered shape, wherein the resonator enclosure has a first width in a middle location, a second width at a first end and a third width at a second end, wherein the first width is greater than the second width and greater than the third width. The resonator may also include a resonator coil, disposed within the resonator enclosure, the resonator coil having the resonator coil having a first end, for connection to an RF drift tube of a drift tube assembly, and a second end, for connection to ground, wherein the resonator coil defines a prolate shape, having a coil axis extending parallel to an axis of the resonator enclosure.

In a further embodiment, a linear accelerator is provided, including a plurality of acceleration stages, to accelerate an ion beam that is conducted therethrough. A given acceleration stage of the plurality of acceleration stages may include an RF power supply, arranged to output an RF signal, and a drift tube assembly, arranged to transmit the ion beam, and coupled to receive an RF signal that is derived from the RF power supply. The given acceleration stage may also include a resonator, where the resonator include a resonator enclosure, having a tapered shape, wherein the resonator enclosure has a first width in a middle location, a second width at a first end and a third width at a second end, wherein the first width is greater than the second width and greater than the third width. The resonator may further include a resonator coil, disposed within the resonator enclosure, the resonator coil having the resonator coil having a first end, for connection to an RF drift tube of a drift tube assembly, and a second end, for connection to ground, wherein the resonator coil defines a prolate shape.

Figure 1C:
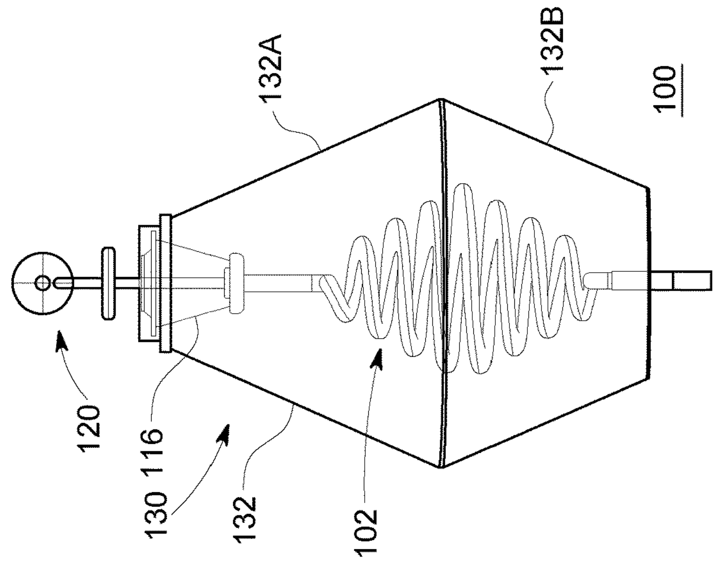
FIG. 1C shows the exemplary acceleration stage of FIG. 1A in an end view.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments provide novel resonator structures for RF linear accelerators (LINACs).

Figure 1B:
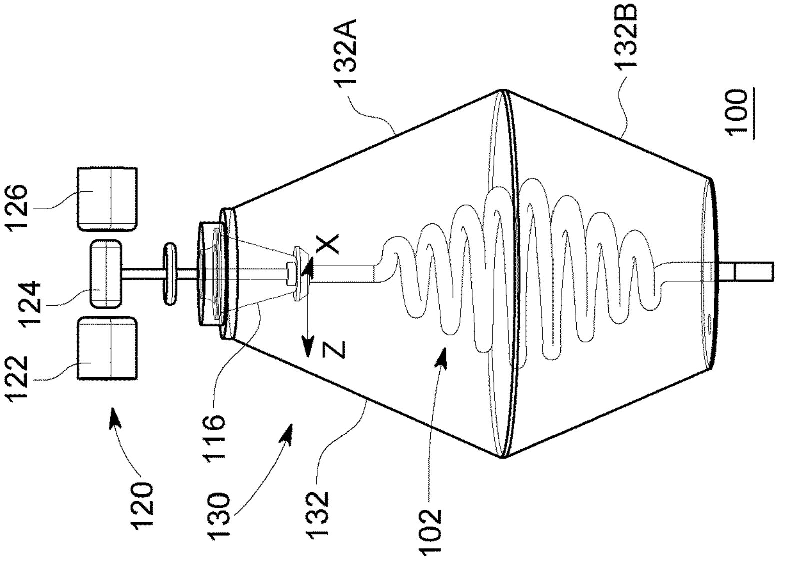
FIG. 1B shows the exemplary acceleration stage of FIG. 1A in a side view.
Figure 1A:
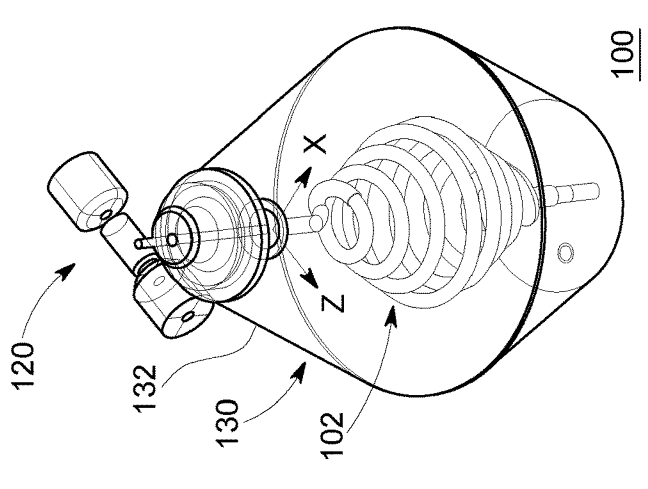
FIG. 1A shows an exemplary acceleration stage in a top perspective view, according to embodiments of the disclosure.
Figure 6:
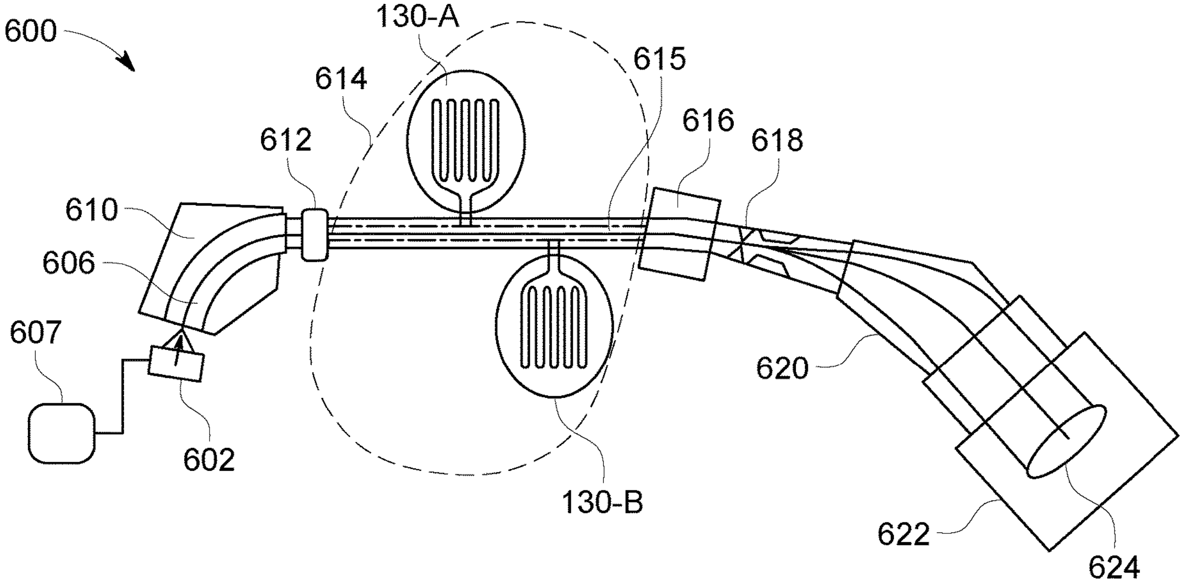
FIG. 6 depicts a schematic of an ion implanter apparatus, according to embodiments of the disclosure.

FIG. 1A, FIG. 1B, and FIG. 1C shows different views of an exemplary apparatus, according to embodiments of the disclosure. The apparatus 100 represents an acceleration stage, including a drift tube assembly 120 and a resonator 130, for accelerating an ion beam in a linear accelerator. As shown in FIG. 6, discussed below, the apparatus 100 may be implemented in a plurality of acceleration stages of a linear accelerator 614 for accelerating an ion beam 606 in an ion implanter 600.

In the embodiment of FIGS. 1A-1C, and as detailed in FIG. 1B the drift tube assembly 120 includes an upstream grounded drift tube, drift tube 122, and a downstream grounded drift tube, drift tube 126, as well as an RF-powered drift tube, drift tube 124. Collectively, the drift tube assembly 120 define a double gap configuration.

The resonator 130 is used to direct power to the drift tube assembly 120, in the form of an RF voltage that is received directly at drift tube 124. Resonator 130 includes a resonator enclosure 132, a coil 102 that is disposed within the resonator enclosure 132, and an insulating feedthrough 116 that electrically isolates the resonator 130. As depicted in FIGS. 1A-1C, the resonator enclosure 132 has a tapered shape that is wider in a middle part of the resonator enclosure. In particular, the resonator enclosure 132 has a first width in a middle location, a second width at a first end and the third width at a second end, where the first width is greater than the first second width and greater than the third width. In some embodiments, the resonator enclosure 132 has a truncated cone shape, where the truncated cone shape is characterized by a pair of truncated cones having a common base that has a diameter equivalent to the first width. This truncated cone shape (actually two truncated cones) may be asymmetric such that the lower cone part 132B has a different length along the Y-axis (or the Cartesian coordinate system shown) in comparison to a length of the upper cone part 132A. Likewise, the width of the lower cone part at the lower end of the resonator enclosure 132 may be different than the width of the upper cone part at the upper end of the resonator enclosure 132.

In various embodiments, coil 102 may have a prolate shape, with a long axis extending along the Y-axis. The details of the shape of coil 102, and similar coils, according to the present embodiments will be discussed below. In brief, the design of the coil 102 and the resonator enclosure 132 will provide improved performance and/or improved LINAC design.

In operation, a first end 112 of the coil 102 is connected to an RF drift tube, such as drift tube 124, and a second end 114 of the coil 102 is connected to ground. An RF signal generated from an RF power supply is directed to the coil 102, such as through an exciter, as known in the art. The coil 102 may be arranged in a manner to resonantly couple to the RF signal according to a resonant frequency of the coil 102, as arranged within the resonator 130. Ideally, coil 102 should be arranged such that the resonant frequency of the coil 102 matches the frequency of the applied RF signal. In addition, the design of coil 102 and resonator enclosure 132 may be such that the shunt impedance generated by resonator 130 is within a suitable range.

Figure 2C:
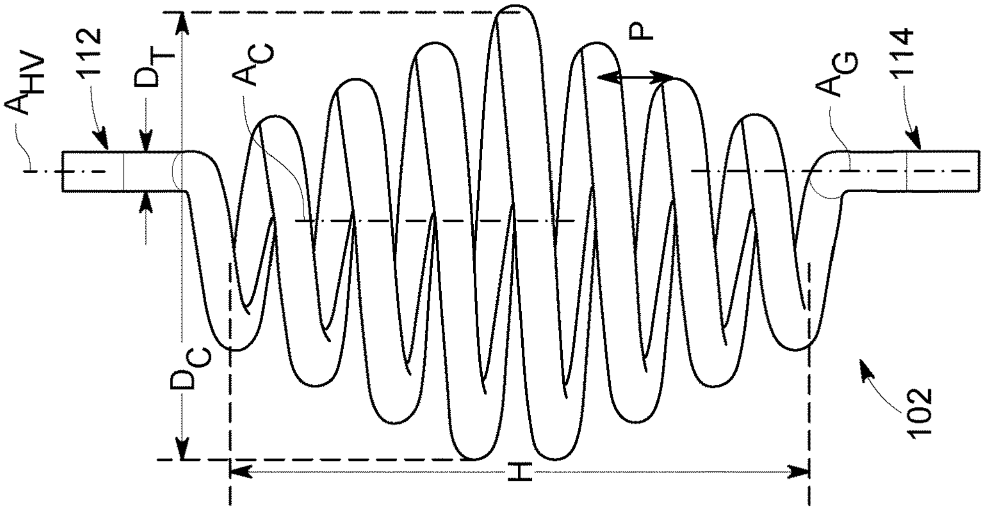
FIG. 2C shows a close up view of an exemplary resonator coil, according to embodiments of the disclosure.
Figure 2B:
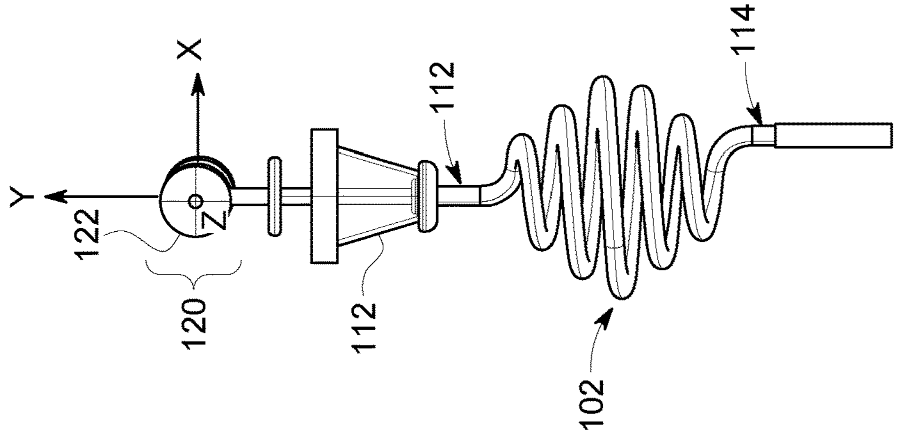
FIG. 2B shows the exemplary resonator coil arrangement of FIG. 2A, in an end view.
Figure 2A:
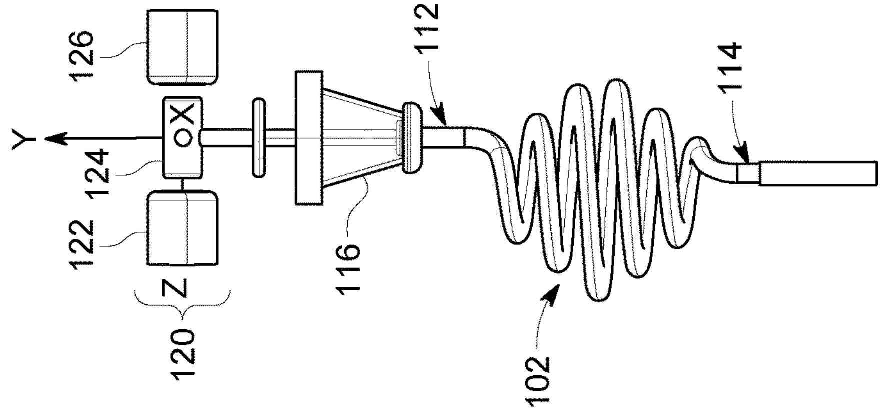
FIG. 2A shows an exemplary resonator coil arrangement, in a side view.

FIG. 2A shows an exemplary resonator coil arrangement, in a side view. FIG. 2B shows the exemplary resonator coil arrangement of FIG. 2A, in an end view. The resonator coil arrangement depicts a variant of the coil 102, in connection with the insulating feedthrough 116 and the drift tube assembly 120, discussed above. For clarity, the resonator enclosure 132 is omitted. In this embodiment, the coil 102, exhibits a prolate, or tapered shape that is formed of a plurality of windings, in this case, 5 windings. As shown in FIG. 2B, the first end 112 of the coil 102 may be aligned along a different axis than the axis of the second end 114.

FIG. 2C shows a close up view of another exemplary resonator coil, according to embodiments of the disclosure. This view shows a variant of the coil 102 that includes a total of 8 windings. In this variant, a coil axis $A_C$ of the coil 102 is shown. Note that the coil axis $A_C$ need not be aligned with the axes defined by the ends of the coil, meaning the axis on the first, high voltage end of the coil 102, shown as $A_{HV}$ and the axis on the second, ground end of the coil 102, shown as $A_G$. As further depicted in FIG. 2C, the coil 102 may be characterized by certain parameters, such as coil height H, the height along the Y-axis of the coil, a coil diameter $D_C$, meaning the diameter at the widest part of coil 102, as well as the tube diameter $D_T$. Note that according to various embodiments, the coil 102 is formed of a hollow electrically conductive tube that is arranged to accommodate a cooling fluid therein. The coil 102 may also be characterized by a pitch P, which parameter denotes a distance between centers of adjacent turns of the turns of the coil 102. Thus, the coil height H may be considered equal to the number of turns of coil 102 times P.

Figure 2D:
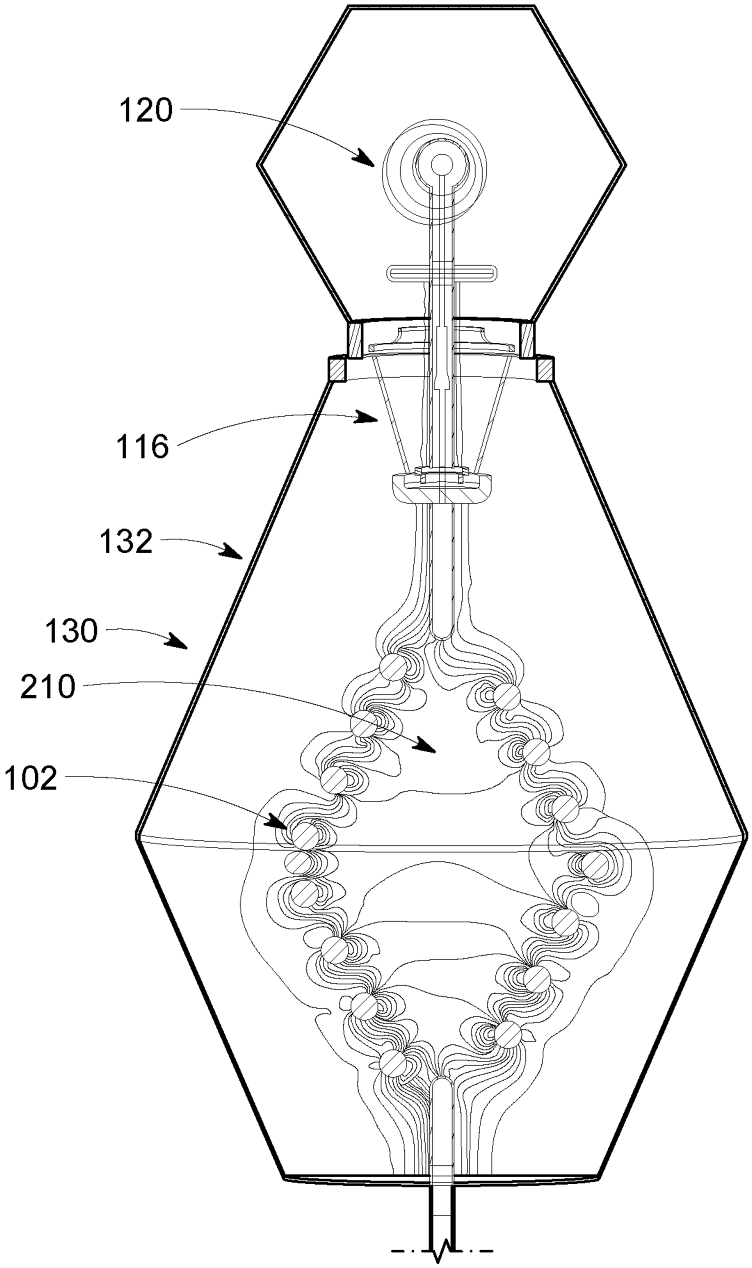
FIG. 2D shows a simulation of magnetic field generated by an exemplary resonator coil, according to embodiments of the disclosure.

FIG. 2D shows a simulation of magnetic fields generate by an exemplary resonator coil, according to embodiments of the disclosure. One feature of the resonator 130, including the coil 102, or similar coils, is that the magnetic fields generated when an RF signal is coupled to the coil 102, tend to be confined to an envelop generally corresponding to the space occupied by the coil 102. This feature is highlighted by the lighter colored areas in the resonator 130, corresponding to the regions of higher magnetic field density.

By way of reference, as noted previously, for efficient linear accelerator operation, the shunt impedance, which entity is a measure of the energy gain per unit power dissipated, should be relatively higher. Moreover, it normalized shunt impedance has been previously shown to be approximately equal to $(L/C)^{1/2}$, where L is the inductance and C the capacitance, meaning that shunt impedance is independent of power delivered to a resonator. The present inventors have discovered new combinations of coil design and resonator enclosure design that can deliver suitable levels of shunt impedance, given constraints of LINAC design, including spatial considerations, such as up to 2.2 MOhm to 2.5 MOhm.

Moreover, the truncated conical architecture of the present embodiments, as illustrated in resonator 130 provides a more space-efficient manner to increase shunt impedance delivered to a linear accelerator. One figure of merit in designing of linear RF accelerators (LINACs) is the shunt impedance per unit volume of the resonator enclosure. Coil inductance and resistance, system capacitance, and coil volume are inter-related parameters which parameters set the resonant frequency and the shunt impedance. When normalized to the volume of the resonator enclosure, a relatively higher shunt impedance, meaning a higher shunt impedance per unit volume, facilitates a relatively smaller footprint of a LINAC and beamline ion implanter, which factor is important in the economy of a fabricator floor space. For instance, this parameter (shunt impedance/resonator enclosure volume) value was increased from 15.9 $MOhm/cm^3$ in the case of a solenoidal coil and cylindrical resonator enclosure to 19.5 $MOhm/cm^3$, in the case of a resonator of the present embodiments, shaped similarly to resonator 130, equivalent to an increase of 23%.

Figure 3A:
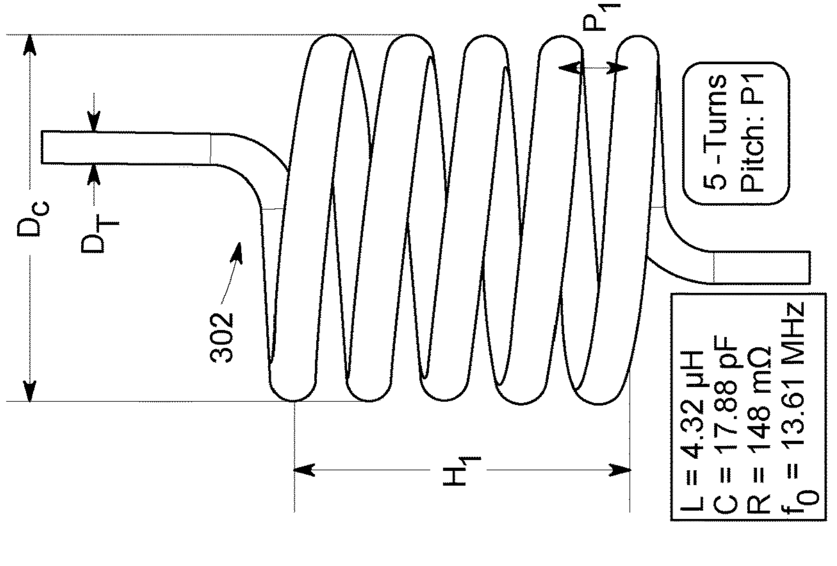
FIG. 3A shows a reference resonator coil shape.
Figure 3B:
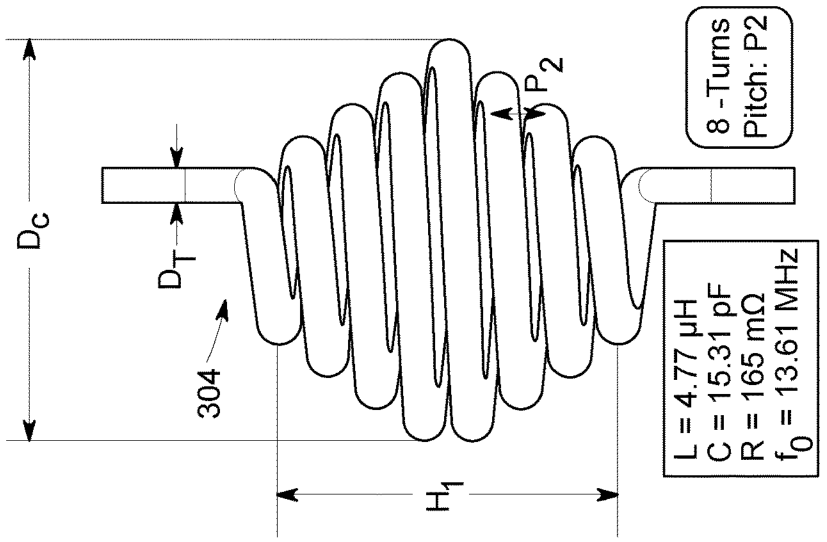
FIG. 3B shows an exemplary resonator coil shape, according to one embodiment.
Figure 3C:
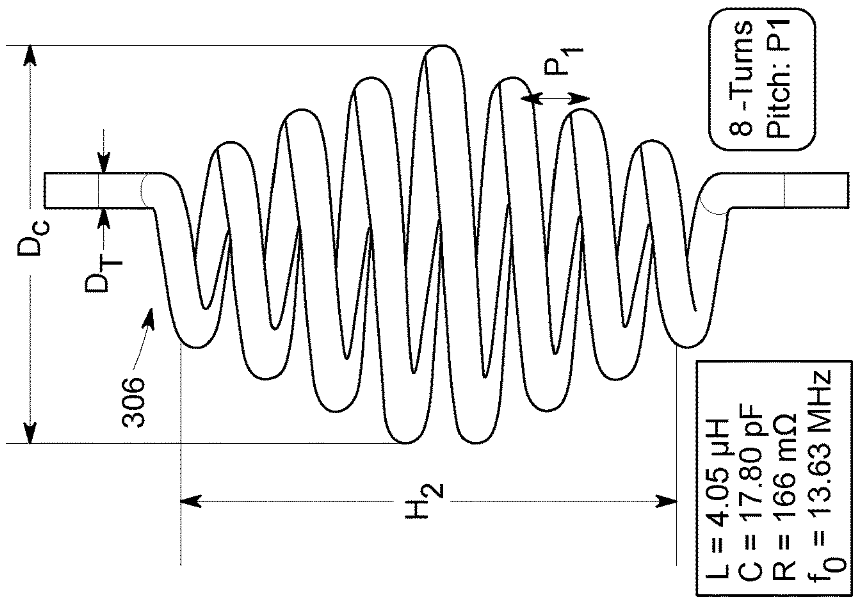
FIG. 3C shows another exemplary resonator coil shape, according to another embodiment.

To highlight the effect of the resonator design according to the embodiments of the present disclosure, FIG. 3A shows a reference resonator coil shape, while FIG. 3B shows an exemplary resonator coil shape, according to one embodiment, and FIG. 3C shows another exemplary resonator coil shape, according to another embodiment.

Turning in particular to FIG. 3A there is shown a solenoidal coil, denoted as the coil 302. Solenoidal coils are known as suitable structures for powering a resonator. The coil 302 is characterized by a coil height, shown As $H_1$, and a coil diameter $D_C$. The coil 302 is also characterized by a tube diameter $D_T$, which parameter has been discussed above. The coil 302 is further characterized in that the coil 302 is formed of five turns that are spaced according to a pitch $P_1$. Simulation of the electrical properties of the coil 302 indicate a value of L=4.32 μH, a value of C=17.88 pF, a value of resistance R=148 mΩ, and a value of resonant frequency of $f_0$=13.61 MHz. Thus, the coil 302 may exhibit an acceptable shunt impedance, based upon the values of L and C.

The coil 302 also exhibits a resonant frequency that is suitable for operation with a 13.56 MHz power supply. Note that known resonators may incorporate a tuning capacitor that may adjust the resonant tuning for a coil, when the coil exhibits an inherent resonant frequency that deviates no more than a given value from the drive frequency of the power supply. For example, a tuning capacitor may effectively tune a resonator when the resonant frequency of the resonator coil is within 1 MHz of the drive frequency, such as 13.56 MHz. Thus, the coil 302, exhibiting a resonant frequency of 13.61 MHz, will readily couple to a 13.56 MHz drive signal with the aid of a tuning capacitor.

In FIG. 3B, a coil 304 is shown, and is shaped according to the present embodiments to have a tapered or prolate shape, as described above. The coil 304 is specifically designed to exhibit the same values $H_1$, and a coil diameter $D_C$ and tube diameter $D_T$, as those parameters exhibited by coil 302. Thus, neglecting coil ends, the coil 304 may be considered to occupy no more than the volume occupied by coil 302. In this embodiment, the coil 304 is further characterized in that the coil 304 is formed of eight turns that are spaced according to a pitch $P_2$. As shown, the pitch $P_2$ is less than the pitch $P_1$ so that the windings of coil 304 are more tightly spaced compared to the windings of coil 302.

Simulation of the electrical properties of the coil 304 indicate a value of L=4.77 μH, a value of C=15.31 pF, a value of R=165 mΩ, and a value of $f_0$=13.99 MHz. Thus, the coil 304 may exhibit an acceptable shunt impedance, based upon the values of L and C. In this example, the shunt impedance may be approximately 14% higher for coil 304 as opposed to coil 302. Moreover, the resonant frequency for coil 304 is close to the resonant frequency for coil 302, and in the tunning range of the tunning capacitor. Thus, the coil 304 of the present embodiments presents a suitable alternative to the coil 302 in terms of performance and overall size.

One potential drawback of the design for coil 304 is the relatively tight spacing of the turns of coil 304. In various embodiments, resonator coils are arranged to drive RF voltage signals having a relatively large amplitude, such as 100 kV or greater. As such, because of the amplitude of the voltage that may be present in winding of the coil 304, design considerations may favor a relatively larger value for the pitch, to prevent malfunctions, such as arcing. For example, the pitch P of the windings may be inherently understood to be not less than the tube diameter $D_T$, and a design rule for safer operation may call for pitch to exceed the tube diameter by a specified amount. In one example, the design may be such that wherein $P/D_T$ is greater than or equal to 2.

In FIG. 3C, a coil 306 is shown, and is shaped according to the present embodiments to have a tapered or prolate shape, as described above. The coil 306 is specifically designed to exhibit the same values coil diameter $D_C$ and tube diameter $D_T$, as those parameters exhibited by coil 302 and 304. The coil 306 is also designed to have the same value of pitch $P_1$ as exhibited by coil 302. In this embodiment, the coil 306 is further characterized in that the coil 306 is formed of eight turns that are spaced according to a pitch $P_1$. At this greater pitch relative to the pitch of coil 304, the coil 306 still exhibits suitable electrical properties as shown: in particular, a value of inductance L=4.05 μH, a value of capacitance C=17.80 pF, a value of resistance of R=166 mΩ and a value of resonant frequency $f_0$=13.63 MHz. Thus, the resonant frequency for coil 306 is the nearly the same as the resonant frequency for coil 302 and slightly lower than for the coil 304. Moreover, based upon the values of L and C, the shunt impedance is approximately 98% of the shunt impedance of coil 302. Thus, the coil 304 of the present embodiments presents a suitable alternative to the coil 302 in terms of performance.

One difference in the coil design of coil 306 is that the height of the coil shown as $H_2$, is greater than the height for coil 302, for example. This result stems from the fact that the coil 306 uses 8 turns as opposed to five turns in coil 304. By proper resonator enclosure design, this relatively larger height of a resonator coil need not impose a penalty in terms of performance of LINAC design. As disclosed in the embodiments of FIG. 1A-1C, a resonator enclosure may assume the shape of a truncated cone or a pair of truncated cones. Thus, these pair of truncated cones may roughly mimic the tapered shape of a resonator coil enclosed therein. Moreover, this tapered design may facilitate better packing of resonators in a LINAC having multiple resonators.

Figure 4:
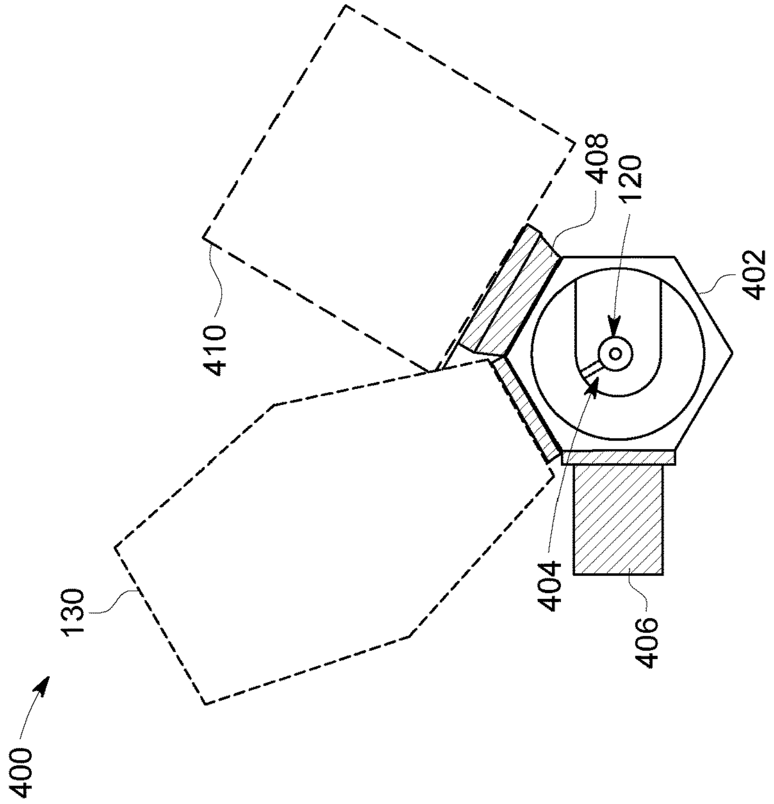
FIG. 4 shows an end view of a portion of an exemplary linear accelerator, according to embodiments of the disclosure.

To further highlight the above issue, FIG. 4 shows an end view of a portion of an exemplary linear accelerator, according to embodiments of the disclosure. In the view of FIG. 4 a linear accelerator 400 is shown, including a vacuum enclosure 402. The vacuum enclosure 402 may house various components of the linear accelerator 400, including the drift tube assembly 120, discussed above, which assembly may include supports 404. In addition, the vacuum enclosure 402 may house quadrupoles (not shown) as known in the art. In operation, the linear accelerator will conduct an ion beam (not shown) generally along the Z-axis (see FIG. 1B) through the drift tube assembly 120, so as to accelerate the ion beam.

As further depicted in FIG. 4, various components may be attached externally to the vacuum enclosure 402, including, for example, a pumping assembly 406, to evacuate the vacuum enclosure 402. In addition, a resonator 130 may be attached to the vacuum enclosure 402 at each stage of the linear accelerator 400. For simplicity, just one resonator, resonator 130, is shown, attached along one side of the vacuum enclosure 402. However, according to various non-limiting embodiments, an actual linear accelerator may have several acceleration stages, including several resonators, such as four acceleration stages, six acceleration stages, eight acceleration stages, ten acceleration stages, twelve acceleration stages, and so forth. As such, the arrangement of resonators may play an important consideration in linear acceleration design.

Figure 5:
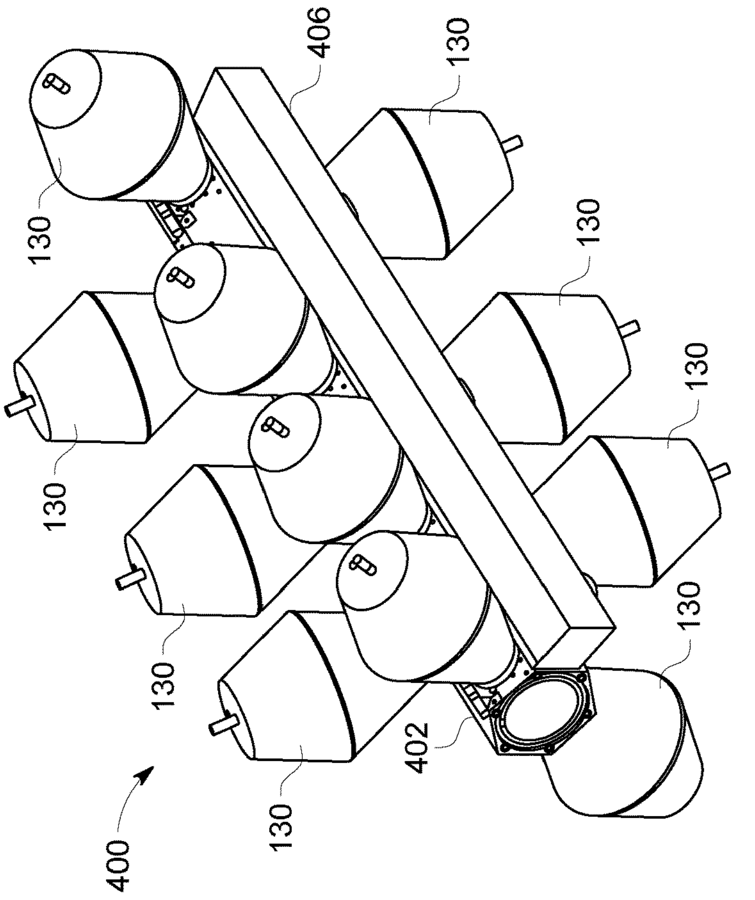
FIG. 5 depicts a top perspective view of an exemplary linear accelerator, according to some embodiments of the disclosure.

FIG. 5 depicts a top perspective view of an exemplary linear accelerator, according to some embodiments of the disclosure. In this example, the linear accelerator 400 may be a variant of the apparatus shown in FIG. 4. For purposes of illustration, the linear accelerator 400 includes a dozen or more acceleration stages, where each acceleration stage is represented by a resonator 130. As shown, the resonators 130 are arranged to couple to the exterior of the vacuum enclosure in a staggered fashion. Thus, along a given side of the vacuum enclosure 402, the resonators 130 are spaced apart from one another. For example, resonators for acceleration stages 1, 5, and 9 may be arranged along a first side of the vacuum enclosure, while resonators for acceleration stages 2, 6, and 10 may be arranged along a second side of the vacuum enclosure 402, resonators for acceleration stages 3, 7, and 11, along a third side of the vacuum enclosure 402, resonators for acceleration stages 4, 8, and 12, along a fourth side of the vacuum enclosure 402.

Moreover, because of the tapered structure of the resonators 130, the diameter of the resonator enclosure decreases at the end that attaches to the vacuum enclosure 402. Thus, the resonators 130 tend to accommodate more room for accessing the vacuum enclosure 402 and/or attaching more components to vacuum enclosure 402, as well as facilitating the spacing of the resonators 130 closer to one another. This consideration is further highlighted in FIG. 4, exhibiting a reference resonator shape 410. The reference resonator shape 410 is sized and positioned to simulate the attachment of a resonator enclosure for a solenoidal resonator coil that has similar width and performance to a corresponding tapered resonator coil for the resonator 130. In this case, the reference resonator shape 410 may represent a cylindrical enclosure having uniform cylinder diameter. As shown, the reference resonator shape 410 occupies more space proximate to the vacuum enclosure 402, and thus may be less accommodating to other components to be attached to the vacuum enclosure 402, including other resonators.

FIG. 6 depicts a schematic of an ion implanter apparatus, according to embodiments of the disclosure. The ion implanter 600 includes a linear accelerator 614. The ion implanter 600, may represent a beamline ion implanter, with some elements not shown for clarity of explanation. The ion implanter 600 may include an ion source 602, and a gas box 607 as known in the art. The ion source 602 may include an extraction system including extraction components and filters (not shown) to generate an ion beam 606 at a first energy. Examples of suitable ion energy for the first ion energy range from 5 keV to 300 keV, while the embodiments are not limited in this context. To form a high energy ion beam, the ion implanter 600 includes various additional components for accelerating the ion beam 606.

The ion implanter 600 may include an analyzer 610, functioning to analyze the ion beam 606 as in known apparatus, by changing the trajectory of the ion beam 606, as shown. The ion implanter 600 may also include a buncher 612 (which component may be considered to be the first part of a linear accelerator), and a linear accelerator 614 (shown in the dashed line), disposed downstream of the buncher 612. The linear accelerator 614 is arranged to accelerate the ion beam 606 to form a high energy ion beam 615, greater than the ion energy of the ion beam 606, before entering the linear accelerator 614. The buncher 612 may receive the ion beam 606 as a continuous ion beam and output the ion beam 606 as a bunched ion beam to the linear accelerator 614. The linear accelerator 614 may include a plurality of acceleration stages, represented by the resonators 130-A, 130-B. etc.), arranged in series, as shown. In various embodiments, the ion energy of the high energy ion beam 615 may represent the final ion energy for the ion beam 606, or approximately the final ion energy. In various embodiments, the ion implanter 600 may include additional components, such as filter magnet 616, a scanner 618, collimator 620, where the general functions of the scanner 618 and collimator 620 are well known and will not be described herein in further detail. As such, a high energy ion beam, represented by the high energy ion beam 615, may be delivered to an end station 622 for processing a substrate 624. Non-limiting energy ranges for the high energy ion beam 615 include 500 keV-10 MeV, where the ion energy of the ion beam 606 is increased in steps through the various acceleration stages of the linear accelerator 614. In accordance with various embodiments of the disclosure, the acceleration stages of the linear accelerator 614 are powered by the resonators 130, where the design of resonators 130 may be in accordance with the embodiments of FIGS. 1A-3C.

In view of the above, the present disclosure provides at least the following advantages. For one advantage, the tapered resonator structure of the present embodiments facilitates more efficient energy conversion of an RF power delivered from external power supplies, facilitating the use of lower power RF generators, or a lesser number of resonators for a final targeted ion beam energy. As another advantage, the tapered resonator structure provides a more efficient packing of resonator enclosures along a LINAC, potentially yielding a shorter beamline for a given number of acceleration stages, and better access to the vacuum enclosure of the LINAC.

While certain embodiments of the disclosure have been described herein, the disclosure is not limited thereto, as the disclosure is as broad in scope as the art will allow and the specification may be read likewise. Therefore, the above description is not to be construed as limiting. Those skilled in the art will envision other modifications within the scope and spirit of the claims appended hereto.

The invention claimed is:

1. An ion implanter, comprising:
- an ion source to generate an ion beam; and
  - a linear accelerator, to transport and accelerate the ion beam, the linear accelerator comprising a plurality of acceleration stages, wherein a given acceleration stage of the plurality of acceleration stages comprises:
    - an RF power supply, arranged to output an RF signal;
    - a drift tube assembly, arranged to transmit the ion beam, and coupled to the RF power supply; and
    - a resonator, the resonator comprising a resonator enclosure, having a tapered shape, wherein the resonator enclosure has a first width in a middle location, a second width at a first end and a third width at a second end, wherein the first width is greater than the second width and greater than the third width.

2. The ion implanter of claim 1, wherein the resonator enclosure has a truncated cone shape, wherein the truncated cone shape is characterized by a pair of truncated cones having a common base that has a diameter equivalent to the first width.

3. The ion implanter of claim 1, wherein the resonator comprises a coil that has a prolate shape, the coil having a first end, connected to an RF drift tube of the drift tube assembly, and a second end, connected to ground.

4. The ion implanter of claim 3, the coil having a coil axis, wherein the first end and the second end of the coil are displaced from the coil axis.

5. The ion implanter of claim 4, wherein the first end and the second end of the coil are not aligned along a common axis.

6. The ion implanter of claim 4, wherein the resonator enclosure defines an enclosure axis, wherein the coil axis is offset from the enclosure axis.

7. The ion implanter of claim 4, wherein the prolate shape is arranged to reduce a magnetic field at an inner surface of the resonator enclosure.

8. The ion implanter of claim 1, wherein the drift tube assembly comprises a double gap configuration.

9. The ion implanter of claim 3, wherein the coil is formed by a tube having a tube diameter $D_T$, wherein the coil is characterized by a plurality of turns, wherein the plurality of turns have a pitch P between adjacent turns, wherein $P/D_T$ is greater than or equal to 2.

10. The ion implanter of claim 1, wherein a given acceleration stage of the linear accelerator is characterized by a shunt impedance that exceeds 2 MOhm.

11. The ion implanter of claim 1, wherein the linear accelerator is characterized by a shunt impedance/(volume of the resonator enclosure) that is at least 18 $MOhm/cm^3$.

12. A resonator, for a linear accelerator, comprising:
- a resonator enclosure, having a tapered shape, wherein the resonator enclosure has a first width in a middle location, a second width at a first end and a third width at a second end, wherein the first width is greater than the second width and greater than the third width; and
- a resonator coil, disposed within the resonator enclosure, the resonator coil having the resonator coil having a first end, for connection to an RF drift tube of a drift tube assembly, and a second end, for connection to ground, wherein the resonator coil defines a prolate shape, having a coil axis extending parallel to an axis of the resonator enclosure.

13. The resonator of claim 12, wherein the resonator enclosure has a truncated cone shape, wherein the truncated cone shape is characterized by a pair of truncated cones having a common base that has a diameter equivalent to the first width.

14. The resonator of claim 12, the resonator coil having a coil axis, wherein a first end and the a second end of the coil are displaced from the coil axis.

15. The resonator of claim 12, wherein the coil is formed by a tube having a tube diameter $D_T$, wherein the resonator coil is characterized by a plurality of turns, wherein the plurality of turns have a pitch P between adjacent turns, wherein $P/D_T$ is greater than or equal to 2.

16. The resonator of claim 12, wherein the prolate shape is arranged to reduce a magnetic field at an inner surface of the resonator enclosure.

17. The resonator of claim 12, wherein the resonator is characterized by a shunt impedance/(volume of the resonator enclosure) that is at least 18 $MOhm/cm^3$.

18. A linear accelerator, comprising:
- a plurality of acceleration stages, to accelerate an ion beam that is conducted therethrough, wherein a given acceleration stage of the plurality of acceleration stages comprises:
  - an RF power supply, arranged to output an RF signal;
  - a drift tube assembly, arranged to transmit the ion beam, and coupled to receive an RF signal that is derived from the RF power supply; and
- a resonator, the resonator comprising:
  - a resonator enclosure, having a tapered shape, wherein the resonator enclosure has a first width in a middle location, a second width at a first end and a third width at a second end, wherein the first width is greater than the second width and greater than the third width; and
  - a resonator coil, disposed within the resonator enclosure, the resonator coil having the resonator coil having a first end, for connection to an RF drift tube of a drift tube assembly, and a second end, for connection to ground, wherein the resonator coil defines a prolate shape.

19. The linear accelerator of claim 18, wherein the resonator enclosure has a truncated cone shape, wherein the truncated cone shape is characterized by a pair of truncated cones having a common base that has a diameter equivalent to the first width.

20. The linear accelerator of claim 19, further comprising a vacuum enclosure, the vacuum enclosure housing a plurality of drift tube assemblies that are arranged along the plurality of acceleration stages, wherein a plurality of resonator enclosures are arranged along an exterior of the vacuum enclosure in a staggered fashion.

* * * * *